(12) United States Patent
Omura et al.

(10) Patent No.: US 7,572,162 B2
(45) Date of Patent: Aug. 11, 2009

(54) DISPLAY PANEL MANUFACTURING METHOD AND DISPLAY PANEL

(75) Inventors: Tetsuji Omura, Moriguchi (JP); Ryuji Nishikawa, Moriguchi (JP)

(73) Assignee: Sanyo Electric Co., Ltd. (JP)

( * ) Notice: Subject to any disclaimer, the term of this patent is extended or adjusted under 35 U.S.C. 154(b) by 255 days.

(21) Appl. No.: 10/586,821

(22) PCT Filed: Jun. 13, 2005

(86) PCT No.: PCT/JP2005/010804

§ 371 (c)(1),
(2), (4) Date: Jul. 19, 2006

(87) PCT Pub. No.: WO2005/122645

PCT Pub. Date: Dec. 22, 2005

(65) Prior Publication Data

US 2007/0164672 A1   Jul. 19, 2007

(30) Foreign Application Priority Data

Jun. 11, 2004   (JP) ............... 2004-174162

(51) Int. Cl.
*H01J 9/00* (2006.01)
(52) U.S. Cl. ............... 445/24; 445/25; 313/512
(58) Field of Classification Search .......... None
See application file for complete search history.

(56) References Cited

U.S. PATENT DOCUMENTS 5,392,144 A * 2/1995 Nishida et al. ............ 359/588
5,867,149 A * 2/1999 Jaeger ...................... 345/172

(Continued)

FOREIGN PATENT DOCUMENTS

JP   01234339 A * 9/1989

(Continued)

OTHER PUBLICATIONS

Notice to Submit Argument for the corresponding Korean Patent Application No. 10-2006-7015543 and its excerpt English translation dated Jul. 16, 2007.

(Continued)

*Primary Examiner*—Peter J. Macchiarolo
*Assistant Examiner*—Donald L Raleigh
(74) *Attorney, Agent, or Firm*—Cantor Colburn LLP

(57) ABSTRACT

A frame-shaped groove is formed on a panel adhering part of a sealing board, a paste including low melting point glass powder is buried in the groove, and a frame-shaped glass paste layer is formed. A solvent included in the glass paste layer is volatilized for solidification, and a low melting point glass frame is provided. Then, the low melting point glass frame protruded on the surface of the sealing board is removed, and the surface of a plane including the surface of the adhering part of the sealing board is flattened. A low heat resistant layer is formed on the flattened adhering plane of the sealing board. The sealing board is arranged to face an element board at a prescribed interval, laser beams are applied on the low melting point glass frame through the element board, and the area is heated. Thus, the low melting point glass rises, and the sealing board is welded with the element board.

7 Claims, 3 Drawing Sheets

U.S. PATENT DOCUMENTS

| | | | |
|---|---|---|---|
| 5,909,081 A | 6/1999 | Eida et al. | |
| 5,997,377 A * | 12/1999 | Sagara et al. | 445/24 |
| 6,195,142 B1 | 2/2001 | Gyotoku et al. | |
| 7,033,655 B2 * | 4/2006 | Beteille et al. | 428/1.5 |
| 2002/0030437 A1 * | 3/2002 | Shimizu et al. | 313/495 |
| 2003/0141804 A1 * | 7/2003 | Dunham et al. | 313/495 |
| 2004/0051781 A1 | 3/2004 | Kawaguchi et al. | |
| 2004/0160184 A1 * | 8/2004 | Sun et al. | 313/582 |
| 2004/0241920 A1 * | 12/2004 | Hsiao et al. | 438/158 |
| 2005/0029513 A1 * | 2/2005 | Kawashima et al. | 257/40 |
| 2005/0042364 A1 * | 2/2005 | Lee | 427/58 |
| 2006/0202613 A1 * | 9/2006 | Kawaguchi et al. | 313/506 |

FOREIGN PATENT DOCUMENTS

| | | |
|---|---|---|
| JP | 10125463 | 5/1998 |
| JP | 2001189191 | 7/2001 |
| JP | 2001189191 A * | 7/2001 |
| JP | 2004055355 | 2/2004 |

OTHER PUBLICATIONS

Office Action issued Jul. 27, 2006 regarding corresponding Taiwanese Patent Application No. 94119459 with its excerpt English translation.

International Publication No. WO2004/022899A1, publication date Mar. 18, 2004.

International Premliminary Report on Patentability for International Application No. PCT/JP2005/010804 dated Dec. 28, 2006.

* cited by examiner

DISPLAY PANEL MANUFACTURING METHOD AND DISPLAY PANEL

TECHNICAL FIELD

The present invention relates to a display panel including an element substrate having electroluminescence elements formed thereon and a sealing substrate used for sealing a space over the element substrate.

BACKGROUND ART

Thin flat display panels, such as plasma displays (PDPs) and liquid crystal displays (LCDs), have been widely used, and organic electroluminescent (EL) panels using organic EL elements are appearing in the market place.

Organic elements use organic materials as, for example, a light emission material, and the lifetime of the organic materials would be shortened if they contain moisture. To prevent this, a sealing substrate is arranged to face an EL substrate, where EL elements are arrayed in matrix, at a predetermined distance from the EL substrate. The periphery of the substrates is sealed with a seal along the periphery of the substrates in an airtight manner through a resin sealing material to prevent entry of moisture. In addition, a desiccant is encapsulated in the inner space sealed by the sealing substrate to remove moisture.

Typically, a sealing material is made of, for example, an epoxy-based resin which is cured by ultraviolet irradiation. To provide a more airtight seal, however, use of a low melting point glass, such as solder glass, has also been proposed (see, for example, Japanese Patent Laid-open Publication No. 2001-319775).

Each pixel of the organic EL panel is formed by an EL element and other components including a switching TFT for controlling current flow to the EL element, a current drive TFT, etc. These pixels are arrayed in matrix on the element substrate to display images on the entire panel by controlling the display of each pixel.

Organic EL panels include bottom-emission type panels and top-emission type panels, classified according to the direction of light emission. In bottom-emission type panels, light is emitted from a light emitting layer of the organic EL element through the element substrate, while top-emission type panels emit light through the sealing substrate. Top-emission type panels are disclosed in, for example, Japanese Patent Laid-open Publication No. 2002-299044. Advantageously, a larger aperture ratio and higher luminance can be achieved in top-emission type panels, because light is emitted from the light emitting layer without being interrupted by TFTs of each pixel.

A color filter system has been adapted in organic EL panels, which combines one (white) type of light emitting layer with color filters in order to display color images. In the top-emission configuration, color filters are formed on the sealing substrate.

Japanese Patent Laid-open Publication No. 2001-319775 discloses the use of low melting point glass for bonding, wherein the glass is sandwiched between glass substrates (i.e., the element substrate and the sealing substrate) and heat is applied to the glass to weld the substrates together. The low melting point glass is disposed at a desired location by applying a glass paste made of powder of the low melting point glass mixed with a resin binder. Once the glass paste is applied on the substrate, a thermal processing is conducted typically at 450° C. or more for more than several ten minutes in order to remove the solvent from the glass paste and solidify the glass paste.

The color filters used for the organic EL panels are made of organic resins, so that the filters are susceptible to heat, usually having a heat resistance of not more than 200° C.

It is therefore impossible to conduct a thermal processing to the substrate after the color filters are formed on the substrate and the glass paste is applied thereon. Conversely, if the glass paste is applied on the substrate before the color filters are formed, the glass paste forms a convex portion on the surface of the substrate. When such a convex portion exists on the surface where the color filter is to be formed, the color filters cannot be disposed accurately at a predetermined position, because the filters are formed by patterning a resist or the like. In the meantime, a black matrix may be disposed between pixels to prevent mingling of light from each pixel or, alternatively, a phase plate and/or a polarizer are provided to prevent glaring touch or reflection of the display. In the top-emission type panels, the black matrix, the phase plate, and/or the polarizer, etc. are also formed on the side of the sealing substrate and are usually made of resin. Therefore, the black matrix has the same characteristic as the above-mentioned color filters.

DISCLOSURE OF THE INVENTION

The present invention provides a method for manufacturing a display panel including an element substrate with electroluminescent elements formed thereon, and a sealing substrate bonded to the element substrate at a peripheral panel bonding part thereof for sealing a space over the element substrate. The method includes the steps of forming a frame-shaped groove in the panel bonding part of the sealing substrate; forming a frame-shaped glass paste layer by introducing a paste including low melting point glass powder and a solvent into the groove; conducting a thermal processing by volatilizing the solvent contained in the glass paste layer to provide a low melting point glass frame; forming on the surface of the sealing substrate a low heat resistant layer made of a material having a heat resistant temperature lower than the temperature of the thermal processing; and with the element substrate arranged to face the sealing substrate at a predetermined distance, sealing a space between the element substrate and the sealing substrate by directing a laser beam to the low melting point glass frame to heat and melt the low melting point glass, so that the low melting point glass is raised towards the element substrate and both substrates are welded together at the periphery thereof with the raised glass.

According to another aspect of the present invention, the step of forming the glass paste layer also includes introducing the glass paste into the frame-shaped groove in an amount exceeding the volume of the groove, and the method further includes, after volatilizing the solvent in the thermal processing, flattening the surface of the bonding part of the sealing substrate by removing some part of the low melting point glass frame extending over the surface of the sealing substrate.

According to still another aspect of the present invention, the low heat resistant layer formed in the step of forming the low heat resistant layer is at least one of a color filter, a resinous black matrix, a polarizer, and a phase plate.

According to a further aspect of the present invention, in the flattening step, the low melting point glass frame extending over the surface of the sealing substrate is removed by polishing.

According to a still further aspect of the present invention, in the flattening step, the low melting point glass frame running over the surface of the sealing surface is removed to ensure that the surface irregularities of the bonding part of the sealing substrate are not more than 1/10 of the film thickness of the low heat resistant layer which is formed subsequent to the flattening step.

According to a still further aspect of the present invention, the groove formed in the groove forming step has a tapered cross section, with a width of the groove gradually narrowed from the surface of the sealing substrate towards the bottom of the groove.

According to a still further aspect of the present invention, the bottom part of the groove formed in the groove forming step has a smoothly curved cross section.

A display panel according to the present invention includes an element substrate with electroluminescent elements formed thereon and a sealing substrate bonded to the element substrate at a peripheral bonding part thereof for sealing a space over the element substrate. The element substrate and the sealing substrate are sealed and welded together along the peripheries of both substrates with a low melting point glass, where a part of the low melting point glass is introduced into a frame-shaped groove formed in the sealing substrate.

According to another aspect of the present invention, at least one of a color filter, a resinous black matrix, a polarizer, and a phase plate is provided on at least part of the surface of the sealing substrate facing the element substrate.

According to a still another aspect of the present invention, the groove has a tapered cross section, with the width of the groove gradually narrowing from the surface of the sealing substrate towards the bottom of the groove.

According to a further aspect of the present invention, the bottom part of the groove has a smoothly curved cross section.

According to a still further aspect of the present invention, in the direction of the width of the groove, the thickness of the low melting point glass used for bonding the element substrate to the sealing substrate is less than the width of the groove.

According to the present invention, the frame-shaped groove of the sealing substrate is filled with the glass paste and, after volatilizing the solvent contained in the glass paste, excess low melting point glass frame extending (flowing) over the surface of the sealing substrate is removed to flatten the surface of the bonding part of the sealing substrate. Subsequently, a color filter, a resinous black matrix, a polarizer, and/or a phase plate are provided. In this manner, the excess low melting point glass extending over the surface of the sealing substrate is removed to flatten the surface of the bonding part of the sealing substrate, so that the color filter, the resinous black matrix, the polarizer, and/or the phase plate can be formed. In addition, because glass has a very low water permeability, a welded seal using glass reliably prevents the entry of moisture into the internal pixel space, and decreases the necessary amount of, or entirely eliminates the need for, desiccant encapsulated in the internal space.

THE BEST MODE FOR CARRYING OUT THE INVENTION

A preferred embodiment of the present invention will be described below with reference to the attached drawings. In a display panel according to the present invention, pixels are arrayed in a matrix and an electroluminescent element is formed at each pixel.

Figure 1:
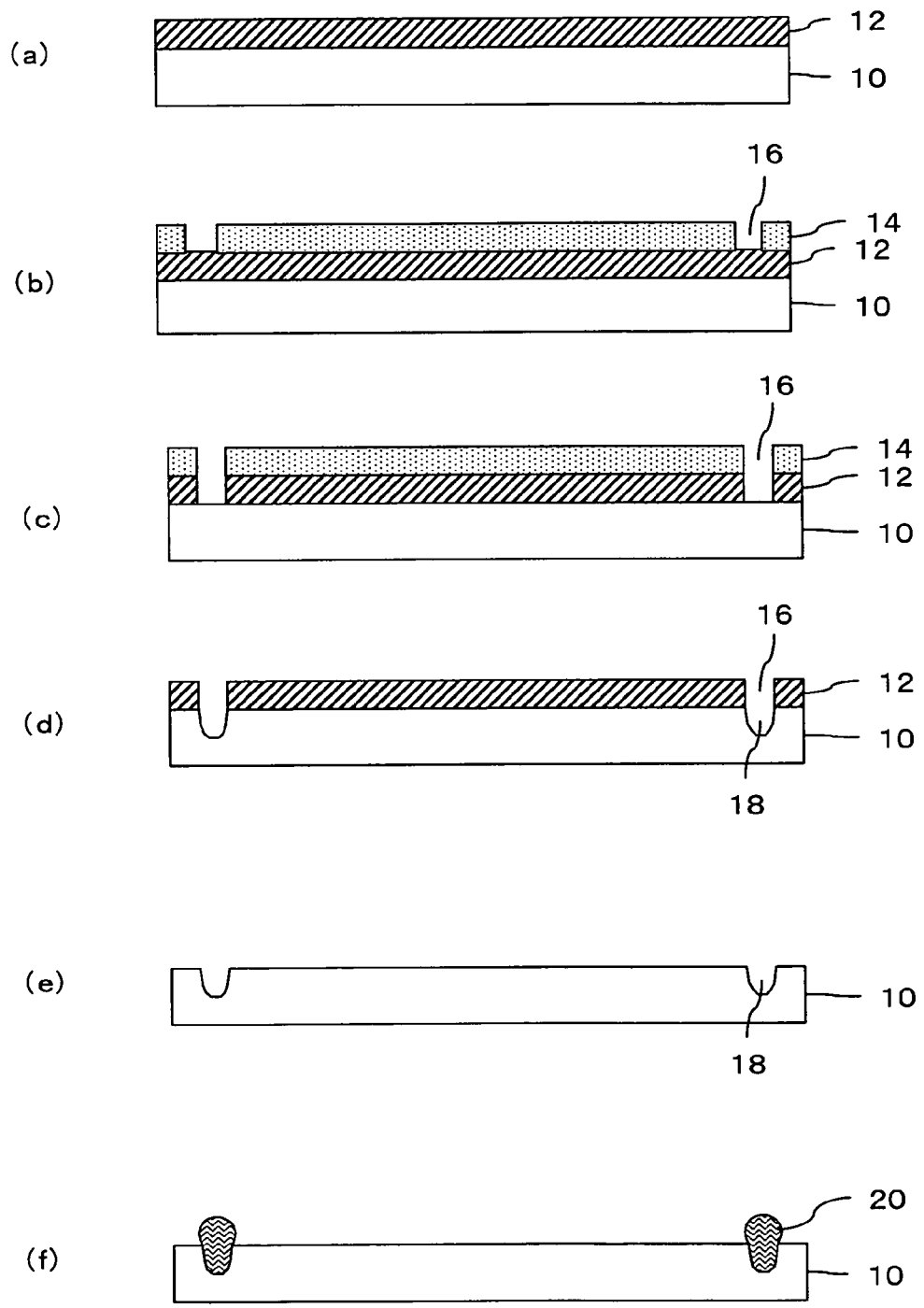
FIG. 1 shows a manufacturing process of a display panel according to the present invention.
Figure 2:
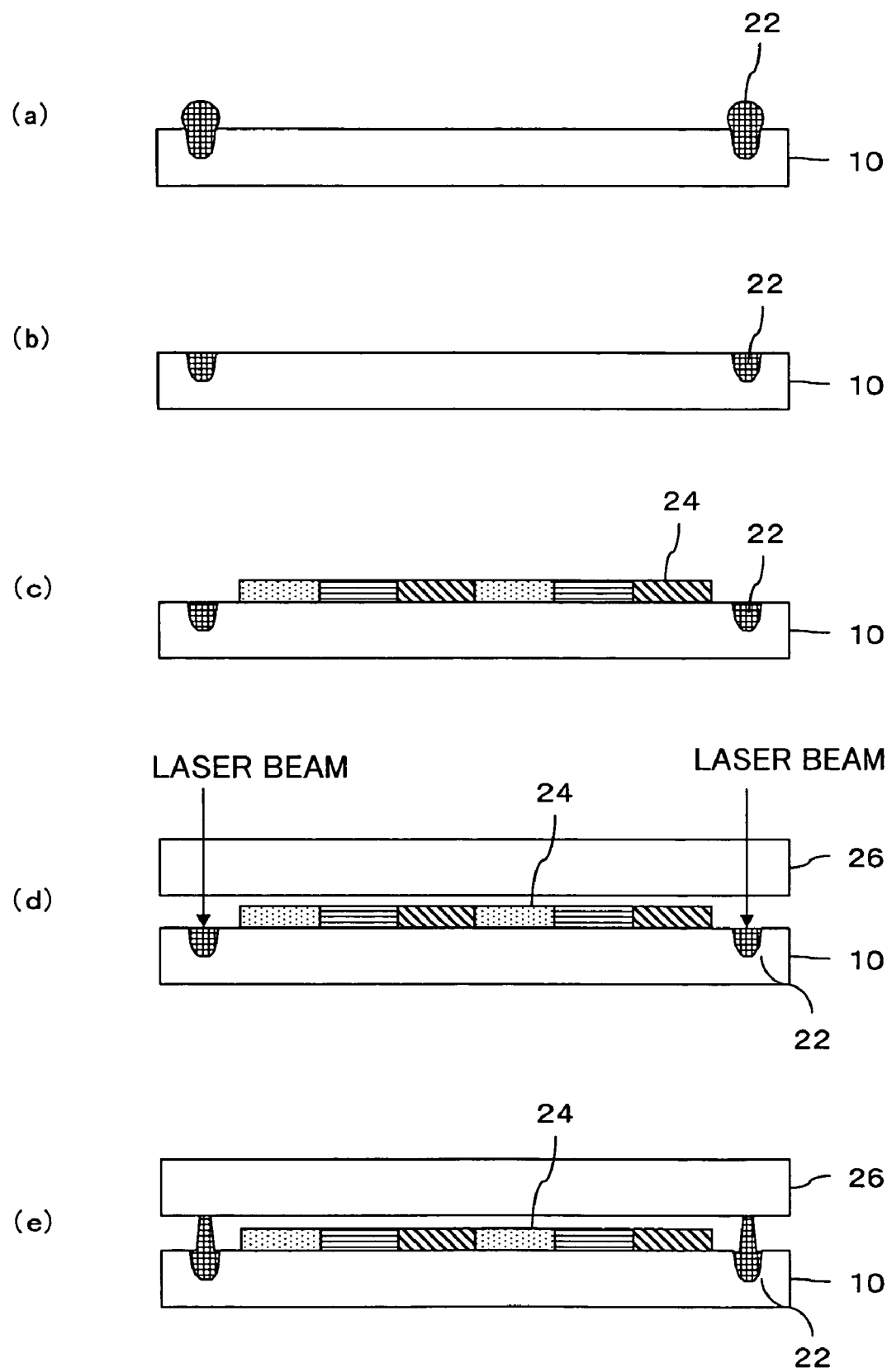
FIG. 2 shows a manufacturing process of a display panel subsequent to the process shown in FIG. 1.

FIGS. 1 and 2 show a manufacturing process of the display panel according to the present invention. Referring to FIG. 1(a), a film 12 is made of a material which is not etched by a hydrofluoric acid-based solution, such as Cr, and this film 12 is formed on the entire surface, including a surface of a bonding part, of a sealing substrate 10 made of glass. Then, a photo resist 14 is applied on the top surface of the film 12 which is then exposed to light via a predetermined mask pattern and developed to form a frame-shaped etching mask aperture 16 in the photo resist 14 corresponding to the mask pattern as shown in FIG. 1(b). As a result, the portion of the film 12 corresponding to the bottom of the etching mask aperture 16 of the photo resist 14 is exposed.

Subsequently, the exposed part of the film 12 is etched. When the film 12 is a Cr film, the exposed part is etched through a typical wet etching using a Cr etching solution, and the etching mask aperture 16 is grown to near the surface of the sealing substrate 10 as shown in FIG. 1(c). Using photolithography, the etching mask aperture 16 can be formed accurately at a predetermined position with a predetermined size. The resulting etching mask aperture 16 has a width of about 0.5 mm to 1 mm.

Then, as shown in FIG. 1(d), the sealing substrate 10 is etched from the etching mask aperture 16. Wet etching using a hydrofluoric acid-based etchant or dry etching using a hydrofluoric acid-based gas may be employed. One of these etching methods, or a combination thereof, is used to form a groove 18 having a depth of about 300 μm in the sealing substrate 10. It is preferable to remove the photo resist 14 in advance, but it can be removed during the etching of the sealing substrate 10.

The groove 18 has a tapered cross section with its width gradually narrowed from the surface of the sealing substrate 10 towards the bottom of the groove, so that glass powder paste will be fulfilled in the groove 18 without gap in the subsequent step. In addition, the bottom of the groove 18 preferably has a smoothly curved cross section. Such a groove 18 can be obtained when appropriate etching conditions are selected in the above-mentioned etching methods.

As shown in FIG. 1(e), the film 12 is then removed.

Then, as shown in FIG. 1(f), the groove 18 is filled with a glass paste containing low melting point glass powder by pouring the paste into the groove 18 so as to not leave any space in the groove 18. The glass paste is applied in a manner such that it fills the groove 18 and then it rises from the surface of the sealing substrate 10.

The glass paste is in a molten state and dissolved in a solvent, so that the glass paste has a certain level of viscosity and surface tension force sufficient to maintain the raised shape of the paste without spreading over the periphery of the aperture of the groove 18, while having a certain mobility to not leave any space in the groove 18. As such, the frame shaped glass paste layer 20 is formed along the groove 18.

Referring now to FIG. 2(a), the sealing substrate 10 having the glass paste layer 20 formed thereon is heated to volatilize the solvent contained in the glass paste layer 20. The temperature and duration of the thermal processing may be determined properly according to the characteristic of the glass paste 20 used. By heating and volatilizing the solvent, the low melting point glass powder paste layer used for bonding is solidified to make a low melting point glass frame 22.

As shown in FIG. 2(b), a portion of the low melting point glass frame 22 running over the surface of the sealing substrate 10 is polished to flatten the surface of the bonding part of the sealing substrate 10. The low melting point glass frame 22 runs over the surface of the sealing substrate 10 for about several hundred pm. Mechanical polishing or chemical polishing may be used for flattening the surface. Preferably, the surface irregularities of the bonding part of the sealing substrate 10 is made to not more than 1/10 of the thickness of the film of a low heat resistant layer which is to be formed in the subsequent step. For example, in a color filter film, a variation of the film thickness has to be suppressed to typically not more than 10% of the film thickness. To attain this accuracy of the color filter film, i.e., a variation of the film thickness not more than 10% of the film thickness, the surface irregularities of the bonding part must not exceed 1/10 of the film thickness.

It is noted that the flattening step may be skipped if the amount of the glass paste introduced into the groove 18 is appropriately adjusted so as to suppress the surface irregularities of the low melting point glass frame 22 to be not more than 1/10 of the film thickness of the low heat resistant layer when the thermal processing is done.

Referring to FIG. 2(c), a color filter 24 is then formed over a portion of the sealing substrate 10 including the flattened surface of the bonding part. A color filter layer is formed in a transfer film and transferred to the surface of the sealing substrate 10 to provide the color filter 24. The color filter layer formed in the transfer film is pressed against the sealing substrate 10 by moving, for example, a transfer roller to transfer the color filter layer on the area corresponding to individual pixels. When R, G, and B color filters 24 are to be formed, is the filters are formed one by one for each color on the surface of the sealing substrate 10. Preferably, the color filter is made of a negative type photo resist material mixed with a pigment and, when such a material is used, it is possible to remove unnecessary color filter materials from undesired positions by exposure and development of the filter materials.

Because the surface of the bonding part of the sealing substrate 10 is flattened, the color filter layer can be pressed evenly against the surface of the sealing substrate 10, which prevents variation of the filter characteristic caused by uneven pressing and/or abrasion of the color filter 24.

Although a color filter 24 formed by the transfer method was described in the above, other methods for forming a film-shaped color filter, such as spin coating of a color resist or inkjet application of a liquid color filter material may be used. When these methods are used to form the color filter 24, the flatness of the surface of the bonding part of the sealing substrate 10 is still important as in the transferring method. On the flat surface of the bonding part of the sealing substrate 10, where the color filter 24 is formed, a smooth and even color filter 24 can be formed.

In the present embodiment, the color filter 24 is formed in the area corresponding to the pixel area. Alternatively, the color filter 24 may be formed only on at least part of the surface of the sealing substrate facing the element substrate, depending on the color of the light emitted from the EL elements of the element substrate 26, a desired color to be displayed on the display panel, etc.

Then, as shown in FIG. 2(d), the sealing substrate 10 and the element substrate 26 are fixed separated from each other by a distance of 4 μm to 10 μm, preferably about 8 μm. To fix the substrates, at least three spacers, for example, of a predetermined height are arranged on the element substrate 26 so as to support the sealing substrate 10 via the spacers. In this state, a laser beam is directed to the low melting point glass frame 22 via the element substrate 26. The light energy is absorbed by the low melting point glass frame 22, heating and eventually melting the glass frame. When melted, the low melting point glass frame 22 bloats and rises until it contacts the element substrate 26. As a result, the melted low melting point glass forms a welding area having a predetermined contact width on the surface of the element substrate 26. In this process, a scanning speed and output power of the laser beam is properly adjusted to securely weld the periphery of the panel.

Thus, as shown in FIG. 2(e), the element substrate 26 and the sealing substrate 10 are bonded together with the low melting point glass at the peripheral bonding part of both substrates. It should be noted that, in the direction of the width of the groove 18, a thickness of the low melting point glass frame 22 connecting the element substrate 26 with the sealing substrate 10 is less than the width of the groove 18.

The laser beam used in this embodiment is, for example, a beam of light output from a YAG laser having a wavelength of 1064 nm. The laser beam is focused on a spot of the surface of the low melting point glass frame 22 so that a diameter of the spot is relatively larger than the width of the low melting point glass frame 22. The irradiated spot is then heated and melted, and then scanned along the low melting point glass frame 22 to form the required welded seal.

The glass thus bonds the element substrate 26 with the sealing substrate 10 having the color filter 24 formed thereon. In this embodiment, because the seal is made of glass, an improved sealing ability can be achieved compared to a conventional seal made of, for example, epoxy resin or the like. Because water permeability of the glass seal is small, the need for encapsulating a desiccant in the pixel space is eliminated or the amount of a desiccant necessary is minimized. Because the color filter 24 is formed after volatilizing the solvent in the low melting point glass powder paste layer 20 used for bonding, it is not necessary to expose the color filter 24, having a low heat resistance and susceptible to the solvent, in a high temperature atmosphere containing the solvent. In this manner, the space over the element substrate 26 can be sealed without impairing the characteristics of the color filter 24. In addition, a smooth and even color filter 24 can be obtained, because it is formed on the flattened sealing substrate 10, and a uniform characteristic of the filter is achieved within the display area.

Although the laser beam passes through the element substrate 26 to melt the low melting point glass frame 22 in this embodiment, the laser beam may be directed through the sealing substrate 10. In such a case, the laser beam is focused on an area of the surface near the low melting point glass frame 22 in order to facilitate the bloat and contact of the glass towards the element substrate 26.

Further, although in this embodiment the groove 18 of the sealing substrate 10 is formed by wet etching or dry etching, the groove 18 of the sealing substrate 10 may be formed by sand blasting. In sand blasting, the film 12, serving as a patterning mask, can be substituted by a resin film typically used in sand blasting, instead of a material which is not etched in a fluorinated acid-based solution such as Cr.

Further, although in the above-described embodiment the color filter 24 is formed after volatilizing the solvent in the glass paste layer 20 in the thermal processing, the color filter 24 may be replaced by, or used in conjunction with, at least one of a resinous black matrix, a polarizer, a phase plate, or the like. The resinous black matrix is, for example, a black matrix formed by patterning a resin film containing a black pigment such as carbon, which is used for separating pixels.

The polarizer may be formed by, for example, drawing PVA (polyvinylalchol) dyed with iodine, while the phase plate may be made of, for example, PVA grown in one axial direction or two axial directions. The polarizer and the phase plate are used for preventing the surface reflection of the display, or the like. Similar to the color filter 24, the resinous black matrix, the polarizer, and the phase plate, etc. are also less heat resistant and susceptible to solvent, because they include organic resins, and the heat resistant temperature of these components is less than the thermal processing adapted for volatilizing the solvent in the glass paste layer 20. In addition, because the resinous black matrix, the polarizer, and the phase plate, etc. are formed through, for example, application, transfer, and pressing of a resin, as in the color filter 24, flattening of the surface of the sealing substrate 10 is required. In this sense, the resinous black matrix, the polarizer, the phase plate, etc. can be formed with accuracy when the low heat resistant layer including these components is formed on the surface of the sealing substrate including the flattened bonding part. Because these components are formed after the thermal processing, they are not exposed to a high temperature atmosphere containing a solvent. Thus, the space over the element substrate 26 can be sealed without impairing the characteristics of these components.

Although in the above embodiment the resinous black matrix, the polarizer, and the phase plate are described as function layers formed by low heat resistant resin layers, other function layers may also be used conveniently in the present invention, as long as they are made of materials having a heat resistance less than the temperature of the thermal processing of the glass paste layer 20.

Figure 3:
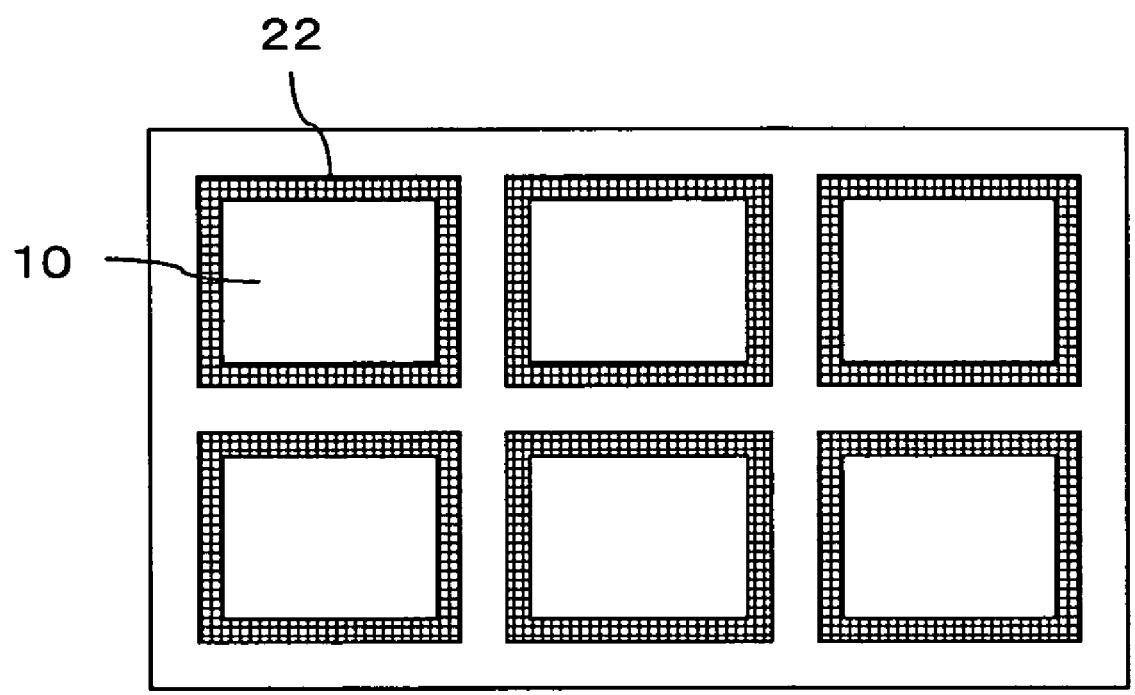
FIG. 3 shows a glass substrate on which a plurality of sealing substrates 10 are provided.

Referring now to FIG. 3, a top surface of a large glass substrate including the surface of the bonding part is shown, on which a plurality of (for example, six, as shown) sealing substrates 10 are formed. As shown in the figure, rectangular frame shaped low melting point glass frames 22 are formed at a predetermined distance from each other. Similarly, a plurality of element substrates 26 are formed on one glass plate, in order to simultaneously fabricate a plurality of element substrates 26. After the two substrates are bonded together, each display panel is cut off using, for example, a diamond cutter or a laser cutter. Bonding and cutting the substrates in one step can be used to further improve the efficiency of process.

The invention claimed is:

1. A display panel manufacturing method, the display panel including an element substrate with electroluminescent elements formed thereon and a sealing substrate bonded to the element substrate at a peripheral panel bonding part thereof for sealing a space over the element substrate, comprising the steps of:

forming a frame-shaped groove on the panel bonding part of the sealing substrate, forming a frame-shaped glass paste layer by introducing a paste including a low melting point glass powder and a solvent into the groove, conducting a thermal processing by volatilizing the solvent contained in the glass paste layer to provide a low melting point glass frame, forming a low heat resistant layer on the surface of the sealing substrate in which the low melting point glass frame is provided, the low heat resistant layer made of a material having a heat resistant temperature lower than the temperature of the thermal processing, and with the element substrate arranged to face the sealing substrate, on which the low heat resistant layer is formed, at a predetermined distance, sealing a space between the element substrate and the sealing substrate by directing a laser beam to the low melting point glass frame to heat and melt the low melting point glass, so that the low melting point glass is raised towards the element and the two substrates are welded together along the peripheries thereof by the raised glass.

2. A display panel manufacturing method according to claim 1, wherein the step of forming the glass paste layer includes introducing the glass paste into the frame-shaped groove in an amount exceeding the volume of the groove, and the method further includes, after volatilizing the solvent in the thermal processing, flattening the surface of the bonding part of the sealing substrate by removing a part of the low melting point glass frame extending over the surface of the sealing substrate.

3. A display panel manufacturing method according to claim 1, wherein the low heat resistant layer formed in the step of forming the low heat resistant layer is at least one of a color filter, a resinous black matrix, a polarizer, and a phase plate.

4. A display panel manufacturing method according to claim 1, wherein in the flattening step, the low melting point glass frame extending over the surface of the sealing substrate is removed by polishing.

5. A display panel manufacturing method according to claim 1, wherein in the flattening step, the low melting point glass frame extending over the surface of the sealing surface is removed to make the surface irregularities of the bonding part of the sealing substrate to not more than $\frac{1}{10}$ of the film thickness of the low heat resistant layer which is formed subsequent to the flattening step.

6. A display panel manufacturing method according to claim 1, wherein the groove formed in the groove forming step has a tapered cross section, with the width of the groove gradually narrowing from the surface of the sealing substrate towards the bottom of the groove.

7. A display panel manufacturing method according to claim 1, wherein the bottom part of the groove formed in the groove forming step has a smoothly curved cross section.

* * * * *

UNITED STATES PATENT AND TRADEMARK OFFICE
CERTIFICATE OF CORRECTION

| | |
|---|---|
| PATENT NO. | : 7,572,162 B2 |
| APPLICATION NO. | : 10/586821 |
| DATED | : August 11, 2009 |
| INVENTOR(S) | : Omura et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 278 days.

Signed and Sealed this

Fourteenth Day of December, 2010

David J. Kappos
*Director of the United States Patent and Trademark Office*